United States Patent

[11] 3,631,308

[72] Inventor Walter F. Krolikowski
Hopewell Junction, N.Y.

[21] Appl. No. 47,773
[22] Filed June 19, 1970
[45] Patented Dec. 28, 1971
[73] Assignee Cogar Corporation
Wappingers Falls, N.Y.

[54] MOS SEMICONDUCTOR DEVICE OPERABLE WITH A POSITIVE OR NEGATIVE VOLTAGE ON THE GATE ELECTRODE AND METHOD THEREFOR
8 Claims, 3 Drawing Figs.

[52] U.S. Cl. .......... 317/235, 317/235 B, 317/234 T
[51] Int. Cl. .......... H01l 11/14
[50] Field of Search .......... 317/235 B, 234 T, 235 G, 235 R, 235 AG

[56] References Cited
UNITED STATES PATENTS
3,500,142 3/1970 Kahng .......... 317/235

OTHER REFERENCES
Ross, E. et al., R.C.A. Review, June 1969, pp. 366–370.

*Primary Examiner*—John W. Huckert
*Assistant Examiner*—Martin H. Edlow
*Attorney*—Harry M. Weiss

ABSTRACT: This disclosure relates to a field-effect transistor-type (MOS) device which is operable with either a positive or negative voltage applied to the gate electrode. In one state of operation, a potential of one amount applied to the gate serves to turn on the field-effect device (forms a channel) to conduct current from the source region to the drain region of the device. In another state of operation, a potential of opposite polarity applied to the same gate electrode serves to turn on the device by means of the tunneling of electrons through the gate insulator into the channel or substrate area located between the source and drain regions. This electron tunneling effect occurs due to the thinness of the insulator layer located between the gate electrode and the semiconductor substrate surface. This latter state of operation provides very fast FET action.

PATENTED DEC 28 1971

3,631,308

INVENTOR
WALTER F. KROLIKOWSKI

BY Harry M Weiss
ATTORNEY

MOS SEMICONDUCTOR DEVICE OPERABLE WITH A POSITIVE OR NEGATIVE VOLTAGE ON THE GATE ELECTRODE AND METHOD THEREFOR

BACKGROUND OF THE INVENTION

1. Field of the Invention

This invention relates generally to semiconductor devices and, more particularly, to field-effect type (MOS) semiconductor devices which are operable with voltages of opposite polarity applied to the gate electrode.

2. Description of the Prior Art

In the past, it was the practice that a normally OFF field-effect transistor (MOS) device could be turned on by applying a potential or voltage of a certain polarity and of a sufficient magnitude to the gate electrode to invert the semiconductor surface region located underneath the gate electrode which is between the source and drain regions thereby creating a conductive channel between the two regions. This type of field-effect transistor device is being used throughout the electronics or computer industry in both logic and memory-type applications. However, one serious disadvantage associated with this general type of field-effect transistor device is that the speed of operation is much slower than the operating speed of bipolar transistor devices.

As a result of this very slow speed of operation, previous field-effect transistor devices of the type described above were predominately used in low-cost, low-performance-type applications whereas bipolar transistor devices were used in high-performance-type applications. A need existed for providing a field-effect-type transistor device which could be used in high-speed circuit applications while preserving the relatively low cost of the field-effect-type device due to the reduced number of processing steps required to make this type of device as distinguished from bipolar-type devices.

Previously, as disclosed in U.S. Pat. No. 3,479,571, a field-effect transistor-type device is described wherein positive or negative potentials are applied to make the device operable. However, in this prior art device, a layer of semiconductor material is deposited on the insulating gate layer thereby producing a sandwich of two semiconductor regions separated by an insulating layer. Thus, a capacitance variation is obtained in the cited prior art structure by applying a positive or negative voltage across the semiconductor layer deposited on the insulating layer. This type of device is much more complex and more costly than a conventional MOS type of device which utilizes a metal gate electrode directly in contact with the insulating layer. Furthermore, there is no apparent speed advantages associated with the cited prior art device.

SUMMARY OF THE INVENTION

It is an object of this invention to provide an improved semiconductor device.

It is another object of this invention to provide an improved field-effect transistor device.

It is still another object of this invention to provide a field-effect transistor device which can be turned on by applying either a particular positive or negative voltage to the gate electrode.

It is a still further object of this invention to provide a fast field-effect transistor-type device.

DESCRIPTION OF THE PREFERRED EMBODIMENTS

In accordance with one embodiment of this invention, a field-effect transistor device is provided which comprises a semiconductor substrate of one conductivity type. Spaced source and drain regions of opposite conductivity type are located in the substrate. Source and drain metal electrodes are in respective electrical contact with the source and drain regions. A thin insulating layer is located on a surface portion of the semiconductor substrate between the source and drain regions. A gate electrode is located on the thin insulating layer. Potential means are connected to the source, drain, and gate electrodes for creating a conducting channel in the substrate between the source and drain regions by applying either a potential of one polarity to the gate electrode in a first operating state or a potential of the opposite polarity to the gate electrode in a second operating state to create electron tunneling through the thin insulating layer. The second operating state is faster than the first operating state and the thin insulating layer is preferably of silicon dioxide having a thickness of about 100 A.

In accordance with another embodiment of this invention, a method of fabricating a field-effect transistor device capable of operating in two different states is disclosed. Spaced source and drain regions of one conductivity type are formed in a substrate of opposite conductivity type. A thin insulating layer is formed on a surface portion of the substrate between the source and drain regions. Metal contacts are applied to the source and drain regions and to the thin insulating layer to form source, drain, and gate electrodes, respectively. Potentials are supplied to the source, drain, and gate electrodes to create a conductive channel in the substrate between the source and drain regions by applying either a potential of one polarity to the gate electrode in a first operating state or a potential of the opposite polarity to the gate electrode in a second operating state to create tunneling through the thin insulating layer.

The foregoing, and other objects, features, and advantages of the invention will be apparent from the following, more particular description of the preferred embodiments of the invention, as illustrated in the accompanying drawing.

BRIEF DESCRIPTION OF THE DRAWINGS

FIG. 1 is a side elevational view showing, in cross section, a field-effect transistor (FET) device in a first operating state with voltages applied to the different electrodes, including the gate electrode, to turn the device on.

FIG. 2 is an enlarged view similar to FIG. 1 showing the operation of the same FET device in a second or tunneling state to turn the device on.

SPECIFICATION

Figure 1:
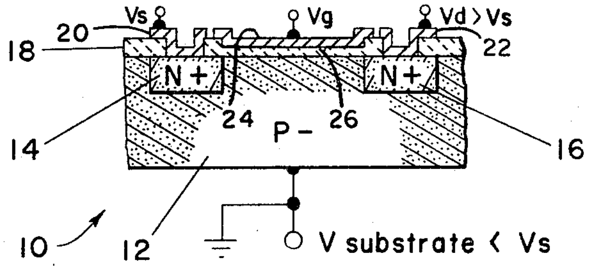

Referring to FIG. 1, a field-effect transistor-type device 10 is shown which comprises, for example, a P-type silicon substrate 12 and two diffused N+ regions 14 and 16 which serve as source and drain regions, respectively. An insulating layer 18 is formed or located on the surface of the semiconductor substrate 12 and electrodes 20 and 22 are provided or applied to the source 14 and drain 16 regions, respectively through openings in the insulating layer 18. A gate electrode 24 is located on a thin insulating layer 26 that is positioned above the P-type substrate surface region located between the source 14 and drain 16 regions. The thin insulating layer 26 is preferably of silicon dioxide or some other suitable insulating layer which has a thickness on the order of about 100 A. This thin insulating layer 26 is sufficiently thick to serve as dielectric protection between the gate electrode 24 and the P-type substrate 12 and yet is thin enough to permit tunneling of electrons through the oxide layer 26 in the manner shown and described more clearly with reference to FIG. 2. The operation of the field-effect transistor device 10 of FIG. 1 in one operating state is achieved by supplying or applying, for example, a voltage $V_s$ of about 2 volts to the source electrode 20 and a drain voltage $V_d$ of about 3 volts to the drain electrode 22. The gate electrode is preferably at a + 2V potential to turn this device on by inverting the surface (N-type channel) under the insulating layer 26. In carrying out the practice of this invention, the conductivities of all regions shown can be reversed from N to P or from P to N and, accordingly, the potentials applied to the electrodes are changed.

Figure 2:
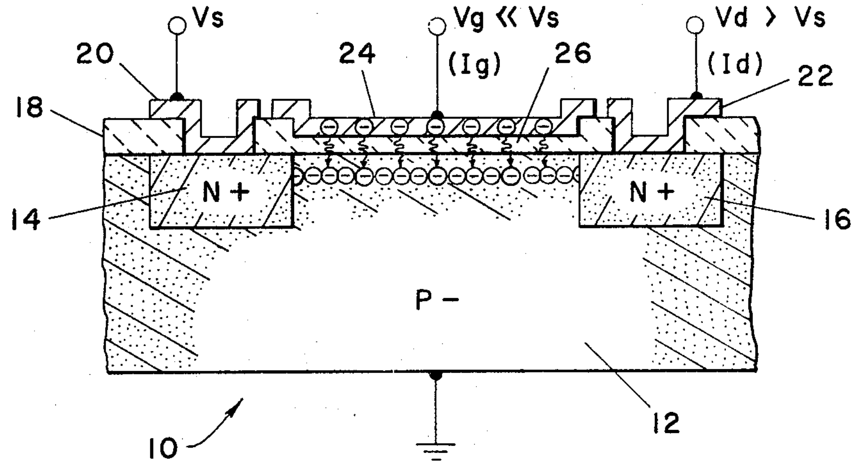

With reference to FIG. 2, the device of FIG. 1 is shown operating in a second operating state which is its tunneling state. By supplying a negative voltage to the gate of a sufficient amount, electrons tunnel through the thin insulating layer 26 from the gate electrode 24 into the semiconductor region of the P-type substrate 12 located between source 12 and drain 14 regions of the device. These tunneled electrons form a conductive path between the source and drain regions of the device. In this embodiment, the source voltage is, for example, at 1 volt, the drain voltage is at 3 volts, and the gate voltage is at a negative 5 volts to permit the device to operate in the second operating state by creating electron tunneling (which is of a quantum mechanical nature) through the insulator layer 26. In this latter embodiment, or second operating state, the (FIG. 2) field-effect transistor is a very fast operating device as compared with the much slower operation of the first operating state shown in FIG. 1.

Figure 3:
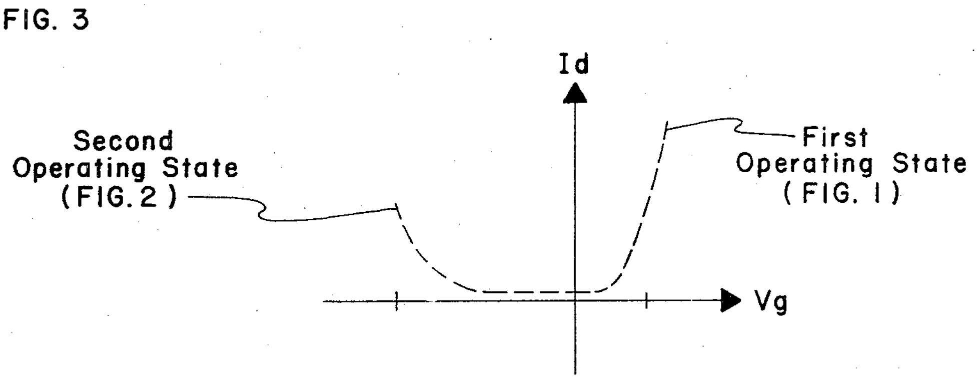
FIG. 3 is a graph illustrating the bistable operation of the device of FIGS. 1 and 2 showing conduction of current of the device in its first state (FIG. 1) and in its second state (FIG. 2).

With reference to FIG. 3, the bistable operating states, as shown in FIG. 1 and in FIG. 2, are graphically illustrated by the curve of this figure which shows a drain current output $I_d$ when a positive voltage $V_g$ of about 2 volts is applied to the gate electrode (first operating state) and a drain current output for a negative voltage of about −5 volts is applied to the gate electrode (second operating state).

While the invention has been particularly shown and described in reference to the preferred embodiments thereof, it will be understood by those skilled in the art that changes in the form and details may be made therein without departing from the spirit and scope of the invention.

What is claimed is:

1. A field-effect transistor device comprising, in combination, a semiconductor substrate of one conductivity type; spaced source and drain regions of opposite conductivity type located in said substrate; source and drain metal electrodes in respective electrical contact with said source and drain regions; a thin insulating layer up to about 100 A. thick located on a surface portion of said semiconductor substrate between said source and drain regions; a gate electrode located on said thin insulating layer; and potential means connected to said source, drain, and gate electrodes for creating a conducting channel in said semiconductor substrate between said source and drain regions by applying a potential of one polarity to said gate electrode in a first on state and a potential of the opposite polarity to said gage electrode in a second on state to create electron tunneling from said gate electrode through said thin insulating layer to the surface of said substrate.

2. A field-effect transistor device in accordance with claim 1 wherein said thin insulating layer comprises silicon dioxide having a thickness of about 100 A.

3. A field-effect transistor device in accordance with claim 1 wherein said substrate is of P-type conductivity, said source and drain regions are of N-type conductivity.

4. A field-effect transistor device in accordance with claim 3 wherein said potential of one polarity being a positive potential, said potential of the opposite polarity being a negative potential.

5. A field-effect transistor device in accordance with claim 3 wherein said potential means applying in said first operating state a voltage of about 2 volts to said source electrode, a voltage of about 3 volts to said drain electrode, and a voltage of about 2 volts to said gate electrode.

6. A field-effect transistor device in accordance with claim 3 wherein said potential means applying in said second operating state a voltage of about 1 volt to said source electrode, a voltage of about 3 volts to said drain electrode, and a voltage of −5 volts to said gate electrode.

7. A field-effect transistor device in accordance with claim 1 wherein said thin insulating layer comprises silicon dioxide having a thickness of about 100 A.; said substrate is of P-type conductivity, said source and drain regions are of N-type conductivity; said potential means applying in said first operating state a voltage of about 2 volts to said source electrode, a voltage of about 3 volts to said drain electrode and a voltage of about 2 volts to said gate electrode; said potential means applying in said second operating state a voltage of about 1 volt to said source electrode, a voltage of about 3 volts to said drain electrode, and a voltage of −5 volts to said gate electrode.

8. A field-effect transistor device in accordance with claim 1 wherein said potential means applying said potential of opposite polarity to said gate electrode switches said device faster than when said potential means applies said potential of one polarity to said gate electrode.

* * * * *